(12) United States Patent
Roch et al.

(10) Patent No.: US 9,764,424 B2
(45) Date of Patent: Sep. 19, 2017

(54) METHOD AND ARRANGEMENT FOR FORMING A STRUCTURING ON SURFACES OF COMPONENTS BY MEANS OF A LASER BEAM

(71) Applicant: Fraunhofer-Gesellschaft zur Foerderung der angewandten Forschung e.V., Munich (DE)

(72) Inventors: Teja Roch, Dresden (DE); Dimitri Benke, Dresden (DE); Andres Fabian Lasagni, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 186 days.

(21) Appl. No.: 14/778,321

(22) PCT Filed: Mar. 13, 2014

(86) PCT No.: PCT/EP2014/055018
§ 371 (c)(1),
(2) Date: Sep. 18, 2015

(87) PCT Pub. No.: WO2014/146974
PCT Pub. Date: Sep. 25, 2014

(65) Prior Publication Data
US 2016/0167165 A1  Jun. 16, 2016

(30) Foreign Application Priority Data
Mar. 21, 2013 (DE) .................. 10 2013 004 869

(51) Int. Cl.
*B23K 26/06* (2014.01)
*B23K 26/00* (2014.01)
*G03F 7/20* (2006.01)

(52) U.S. Cl.
CPC ...... *B23K 26/0608* (2013.01); *B23K 26/0084* (2013.01); *B23K 26/0648* (2013.01); *B23K 26/0652* (2013.01); *G03F 7/70408* (2013.01)

(58) Field of Classification Search
CPC ............ B23K 26/0608; B23K 26/0084; B23K 26/0648; B23K 26/0652
(Continued)

(56) References Cited

U.S. PATENT DOCUMENTS

2006/0148210 A1  7/2006  Furuta et al.
2006/0152791 A1  7/2006  Wolleschensky et al.
(Continued)

FOREIGN PATENT DOCUMENTS

DE  10259443 A1  7/2004
DE  102006000720 A1  9/2006
(Continued)

*Primary Examiner* — Samuel M Heinrich
(74) *Attorney, Agent, or Firm* — Jacobson Holman, PLLC.

(57) ABSTRACT

The invention relates to a method for forming a structuring at surfaces of components using a laser beam. In the invention, a laser beam is directed onto a diffractive optical element. The diffractive optical element is configured such that the laser beam is split into at least two part beams and the part beams are directed at an angle α with respect to the optical axis of the laser beam onto at least one further optical element which is transparent for the laser radiation. The further optical element(s) has/have a first surface and a second surface which is inclined at an angle to the optical axis of the laser beam at which the beam direction of the part beams is changed by optical refraction. A focusing optical lens is arranged in the optical path of the part beams between the further optical element(s) and a component surface to be processed, and the part beams are focused such that they are incident onto the surface of the component at a common position at an angle of incidence β with respect to the optical (Continued)

axis of the laser beam. The distance d1 between the optical elements is changed to change the interference period.

18 Claims, 7 Drawing Sheets

(58) Field of Classification Search
 USPC ............ 219/121.68, 121.69, 121.85, 121.65, 219/121.66; 264/400; 425/174.4; 347/255, 256
 See application file for complete search history.

(56) References Cited

U.S. PATENT DOCUMENTS

| | | | |
|---|---|---|---|
| 2010/0060876 A1 | 3/2010 | Choi et al. | |
| 2014/0226139 A1* | 8/2014 | Csete ................. | G02B 5/1809 355/53 |
| 2014/0291308 A1* | 10/2014 | Lasagni ............. | B23K 26/0084 219/121.75 |

FOREIGN PATENT DOCUMENTS

| | | | | |
|---|---|---|---|---|
| DE | 102006061066 | | 12/2006 | |
| DE | 102011011734 A1 | | 8/2012 | |
| DE | 1020111010415 A1 | * | 11/2012 | ............. G02B 27/00 |
| EP | 2292370 A1 | | 3/2011 | |

\* cited by examiner

METHOD AND ARRANGEMENT FOR FORMING A STRUCTURING ON SURFACES OF COMPONENTS BY MEANS OF A LASER BEAM

The invention relates to a method and to an arrangement for forming a structuring at surfaces of components using a laser beam. One-dimensional or two-dimensional structural elements (pixels) can be formed using the invention. The formation of the structural elements in this respect takes place by means of laser interference structuring.

In this respect, a laser beam has previously been directed onto an optical diffractive element with which the laser beam can be split into a plurality of part beams. The part beams are then directed onto a surface to be structured by two optical focusing lenses arranged spaced apart from one another. In this respect, the beam direction of the part beams are additionally changed by one of the two lenses such that they are incident on the same surface region of a component. Since the optical lenses have a constant focal length, a replacement with at least one other lens having a focal length differing therefrom is necessary if the interference period is to be changed.

In another known possibility for laser interference structuring, a laser beam is split into part beams by means of at least one beam splitter and the part beams are directed onto the surface to be structured from different directions with the aid of reflective elements. In this respect, the part beams should each pass through the same path length up to the incidence on the surface. Such a design requires a large volume so that no compact design is possible. A complex, precise adjustment of reflective optical elements is necessary for an adaptation of the interference period.

A method and an arrangement for optical examination and/or processing of a sample are known from DE 102 59 443 A1.

DE 10 2006 000 720 A1 relates to a laser processing machine for forming grooves.

A diffractive optical arrangement is described in DE 10 2006 061 066 A1.

Possibilities for laser interference structuring are known from DE 10 2011 011 734 A1.

It is therefore the object of the invention to provide a simple, compact assembly which is configured for laser interference structuring, which can be integrated into a mobile assembly and with which the interference period can in particular be varied on the formation of the structural elements.

In accordance with the invention, this object is achieved by a method having the features of claim 1. Claim 13 defines an arrangement. Advantageous embodiments and further developments of the invention can be realized using features designated in the subordinate claims.

In the method in accordance with the invention for forming a surface structuring at surfaces of components using a laser beam, the laser beam is directed onto a diffractive optical element or onto an acousto-optic modulator. The diffractive optical element or the acousto-optic modulator is configured such that the laser beam is split into at least two part beams and the part beams are directed at an angle $\alpha$ with respect to the optical axis of the laser beam onto at least one further optical element which is transparent for the laser radiation, wherein the angle $\alpha$ is preferably the same in each case.

An acousto-optic modulator has a similar operating principle to a diffractive optical element. A diffractive grating is moved by the influence of sound waves.

The term diffractive optical element will be used in the following even though an acousto-optic modulator or a similar phase grating can also be used in its place.

The one or more further optical elements has/have a first surface which is preferably aligned perpendicular with respect to the optical axis of the laser beam. A second surface, which is formed opposite the first surface, is inclined at an angle to the optical axis of the laser beam. The beam direction of the part beams can thereby be changed by optical refraction. The part beams can then advantageously be aligned in parallel with the optical axis of the laser beam. A focusing optical lens is arranged in the optical path of the part beams between the further optical element(s) and a component surface to be processed. The part beams are thus focused such that they are incident onto the surface of the component at a common position at an angle of incidence $\beta$, which is preferably of an equal amount, with respect to the optical axis of the laser beam. They can in this respect be incident on the surface to be structured from different directions in a mirrored manner with respect to the optical axis of the laser beam.

The laser beam should be emitted by a laser beam source in pulse operation. In this respect, pulse durations in the range of nanoseconds up to and into the even smaller picosecond range can be selected. This can in particular be achieved in that a very small path length difference of the part beams up to the incidence on the surface to be structured can be observed. In addition, a laser system can be used which has a small coherence length.

A further optical element can be configured as an optical prism, a wedge plate, in the form of a pyramid or of a truncated pyramid at a surface, in the form of a polyhedron, in the form of a cone or of a truncated cone. It is possible in this respect first to allow the part beams to be incident in a perpendicular manner onto the surface of the further optical element aligned perpendicular to the optical axis of the laser beam and to achieve the deflection of the part beams by optical refraction at the surface of the further optical element arranged thereafter in the direction of beam propagation and correspondingly inclined at an angle. The further optical element can, however, also be arranged rotated about 180° in the optical path of the part beams.

In an embodiment of the arrangement in accordance with the invention in which only one splitting of the laser beam into two part beams takes place, the further optical element can preferably be formed as an optical prism or having two wedge plates whose wedges are aligned in opposite directions to one another. Two wedge plates should lie directly next to one another with a surface which is aligned in parallel with the optical axis of the laser beam or these surfaces should have a distance from the optical axis which is of respectively the same amount so that the part beams are incident onto a surface of the wedge plates at the same distance from the optical axis of the laser beam and are also refracted and have their beam direction changed at a position having the respective same distance from the optical axis of the laser beam on the exit. In this respect, the wedge plates and the angles $\alpha$ should be of equal amounts and the part beams should cover the same path length up to the incidence on the surface to be structured.

With more than two part beams, a polyhedron, a cone or a truncated cone can be used with a further optical element. However, more than two wedge plates can also be used in accordance with the number of part beams, with a respective part beam also being able to be directed onto a wedge plate. With four part beams, a pyramid shape or a truncated pyramid shape is appropriate.

The arrangement which can be used in the invention can thus be configured such that the focusing optical lens can be replaced with a focusing optical lens having a different focal length.

A diffractive grating can preferably be used as the diffractive optical element. It should be aligned in this respect such that the respectively desired number of part beams can be obtained and the part beams observe the respective same angle α in the further course of the optical path after the diffractive optical element.

The respective distance Δx of the part beams from the optical axis of the laser beam in the region of the optical path between the further optical element(s) and the focusing lens is varied by changing the distance d1 between the diffractive optical element and the further optical element and the angle of incidence β of the part beams and the interference period are also changed very easily when changes in the structuring to be formed are desired.

In a further advantageous embodiment, the laser beam can be deflected onto the diffractive optical element at least one-dimensionally so that the point of incidence on the surface of the diffractive optical element and thus a shift of the optical axes of the part beams and a one-dimensional shift of the position onto which the part beams are directed together on the surface of the component are achieved. At least one reflective element which is pivotable about at least one axis can be arranged in the optical path of the laser beam or of the part beams for the deflection of the laser beam or of part beams. A two-dimensional deflection of the laser beam is also possible, for which purpose one reflective element correspondingly pivotable about two axes aligned perpendicular to one another or two reflective optical elements pivotable about a respective one axis can be arranged there.

The laser can be used with a pulse frequency of e.g. >2 kHz which is not possible without such a mirror arrangement, due to the lateral movement of the position which can thus be reached and onto which the two part beams can be incident together onto the surface of the component.

It is also advantageously possible to rotate the diffractive optical element about an axis, whereby a rotation of interference lines is possible and corresponding structurings can be formed. The diffractive optical element can in this respect be rotated about an axis in parallel with the optical axis of the laser beam directed onto the diffractive optical element in a perpendicular manner.

There is also the possibility of changing the distance d2 between the further optical element and the focusing optical lens. The alignment of the part beams can thereby be changed and a corresponding change of the size of the structuring can be achieved since the angles at which the part beams are directed onto the focusing optical element and onto the surface of the component can thereby be changed. Objectives, e.g. in the form of an f-theta objective, can be used alternatively to an optical lens.

In an embodiment of the invention, a laser beam can also be used which has a non-rotationally symmetrical cross-section and/or a modified intensity profile of the laser beam, for example a non-rotationally symmetrical intensity profile or an intensity profile inhomogeneous over the cross-sectional surface. A laser beam formed in this manner can be directed onto the surface of a diffractive optical element and can be split into a plurality of part beams which can then again interfere on the surface of a component.

A non-rotationally symmetrical cross-section of the laser beam, which is directed onto the diffractive optical element, can be achieved by means of the already mentioned deflection with at least one reflective element if the laser beam is not incident onto the surface of the diffractive element in a perpendicular manner. At least one reflective element with a correspondingly curved surface can also be used for this purpose.

A modified intensity profile can be achieved using a semi-transparent or semi-reflective element which has a transmission gradient or a reflection gradient for the respective laser radiation over the surface onto which the laser beam is incident. A so-called gauss-top hat or a top hat-gauss profile can e.g. thereby be formed. An energy density can thereby be achieved which is increased in spots, has an increased destruction threshold and a correspondingly increased material removal over a smaller area on the surface of the component. In this respect, however, a small loss in performance can be accepted in regions with reduced intensity/energy density of the incident part beams. An adaptive optical element or a corresponding optical arrangement of a plurality of optical elements, onto and/or through which the laser beam is directed, can also be used for the formation of a non-rotationally symmetrical intensity profile or an intensity profile inhomogeneous over the cross-sectional surface of the laser beam. Reflective elements can, for example, be used as adaptive optical elements which have a preferably irregularly curved surface, or their surface onto which the laser beam is directed can be changed with respect to its curvature.

The arrangement which can be used in the invention can be very compact, that is, it can be formed with a small required volume and a correspondingly small deadweight. It can therefore be used in conjunction with a manipulator so that a movement also a multidimensional movement, can be achieved over larger surface areas in the surface structuring of components which can also be of a large format and have a large mass.

There is also the possibility of forming linear structural elements with different alignment on a component surface which linear structural elements can then form a pattern or a specific image thereon.

It can also be achieved in this respect that a color impression can be produced on an observation of the structured surface from suitable observation angles.

The part beams can also simply overlap on the surface to be structured at a high focus. It is only necessary in this respect to observe the distance, which takes account of the focal length of the focusing optical lens, between this lens and the surface to be structured.

Spot-like structures can be formed using more than two part beams in which the laser beam is split.

The arrangement which can be used in the invention can also be configured such that it can be rotated about an axis, preferably about the optical axis of the laser beam.

The invention will be explained in more detail by way of example in the following. In this respect, the features shown and explained in the different examples can be combined with one another independently of the respective example.

There are shown.

Figure 1:
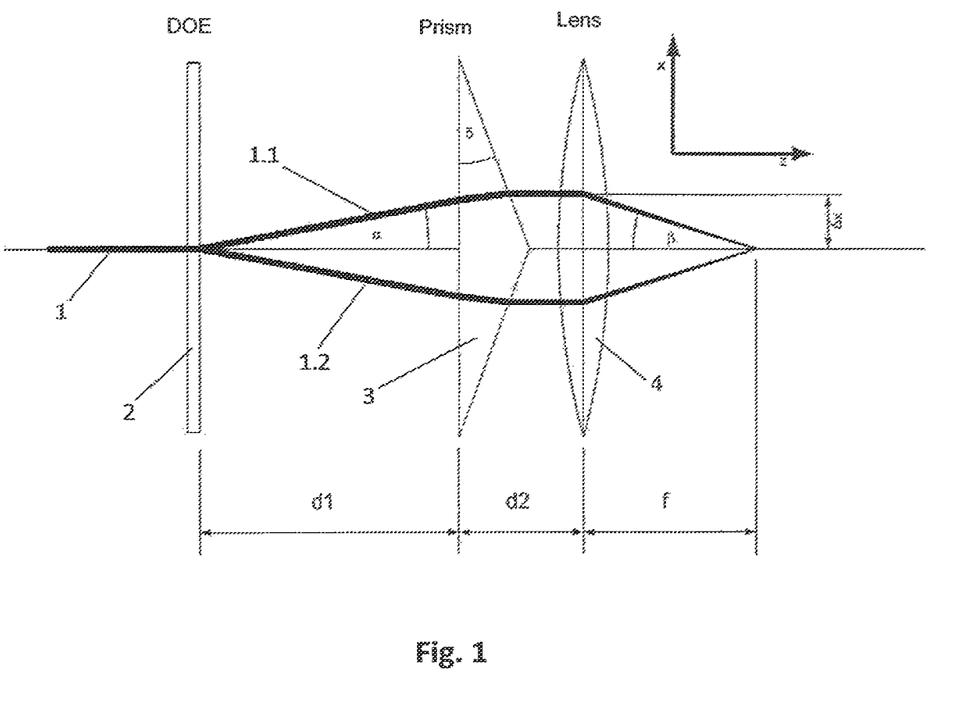
FIG. 1 in schematic form, an example of an arrangement which can be used in the invention.

An arrangement is shown by way of example in FIG. 1 in which a laser beam 1 is directed onto a diffractive optical element 2 with which in this example the one laser beam 1 is split into two part beams 1.1 and 1.2 and both part beams 1.1 and 1.2 are deflected by a respective angle α with respect to the optical axis of the laser beam 1. Both part beams 1.1 and 1.2 are incident on a surface of an optical prism, as a further optical element 3, aligned perpendicular to the optical axis of the laser beam 1. Since the further optical element 3 is transparent for the laser radiation, a further deflection of the both part beams 1.1 and 1.2 takes place at the oppositely disposed surface of the further optical element 3, which is inclined at an angle ±90° with respect to the optical axis, in dependence on the angle of inclination of this surface and the optical refractive index of the further optical element 3. In this respect, the two part beams 1.1 and 1.2 should preferably extend in parallel with the optical axis and in this respect at the same respective distance Δx from the optical axis of the laser beam 1 between the further optical element and the focusing optical lens.

Both part beams 1.1 and 1.2 are then focused on the surface to be structured by the focusing optical lens 4 and are incident on the surface of the component to be structured at a common position at the same respective angle of incidence β from different directions mirrored with respect to the optical axis of the laser beam 1. A direct material removal or a change of the component material takes place there by a phase conversion or a melting as a result of the interference of the two part beams 1.1 and 1.2.

Two wedge plates can also be used in the place of the optical prism. A different diffractive optical element 2 can also be used with which the laser beam 1 can be split into more than two part beams. In this case, a further optical element 3 should be used which is adapted to the position and alignment of the more than two part beams. Examples for this are named in the general part of the description.

The distance d1 between the diffractive optical element 2 and the further optical element 3 can particularly advantageously be changed. The interference period can thereby likewise be changed very simply so that correspondingly different structural elements can be formed at the surface of a component.

Figure 2:
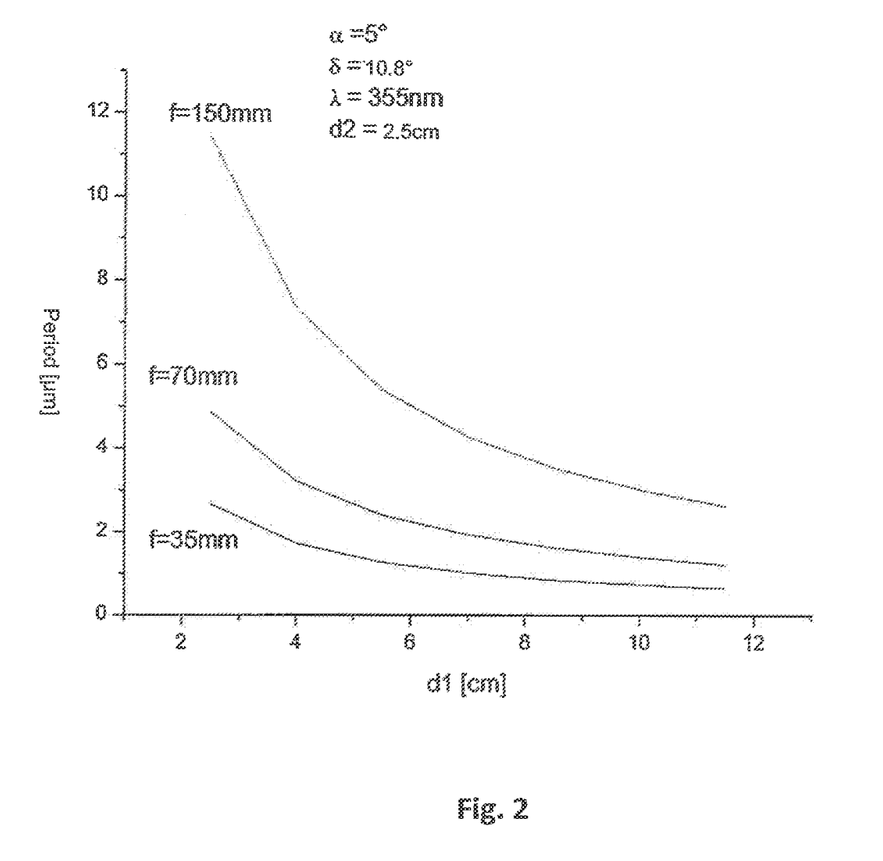
FIG. 2 a diagram with which the dependence of the interference period on the distance d1 is illustrated.

The dependence of the interference period on the distance d1 is illustrated in the diagram shown in FIG. 2 for three focusing optical lenses 4 having focal lengths of 35 mm, 70 mm and 150 mm. It can be recognized in this respect that even small changes of the distance d1 have a large influence on the change of the interference period which can thereby be achieved and this effect is amplified with larger focal lengths of the focusing optical lens.

Figure 3:
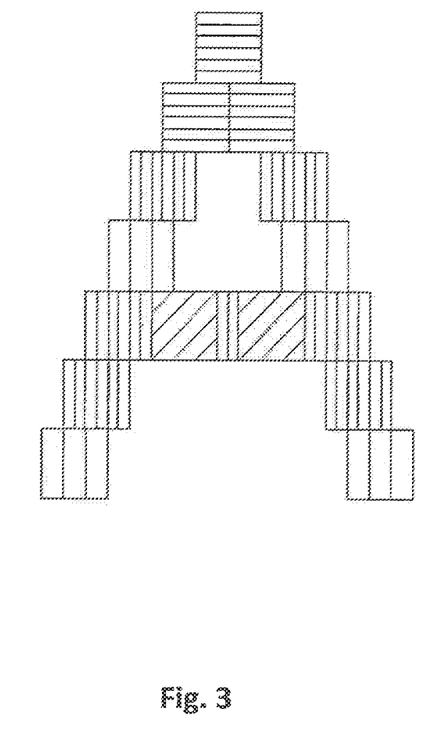
FIG. 3 a schematic representation of structures which can be formed on the surface of a component using the invention.

A structuring formed on a component surface is shown by way of example in FIG. 3. In this respect, the part beams can be focused onto the surface with different interference periods, whereby linear structural elements can be formed with differently large distances from one another at different positions. This can be simply achieved by the variation of the distance d1.

Since an arrangement which can be used in the invention is formed in a very simple and compact manner, such patterns can also be formed in different alignments. The arrangement can in this respect simply be rotated about the optical axis of the laser beam 1 at the respective desired angle. As can be recognized in FIG. 3, linear structures can be formed vertically, horizontally or at any desired angle differing therefrom at different positions on a component surface and different effects can thereby also be achieved there.

Figure 4:
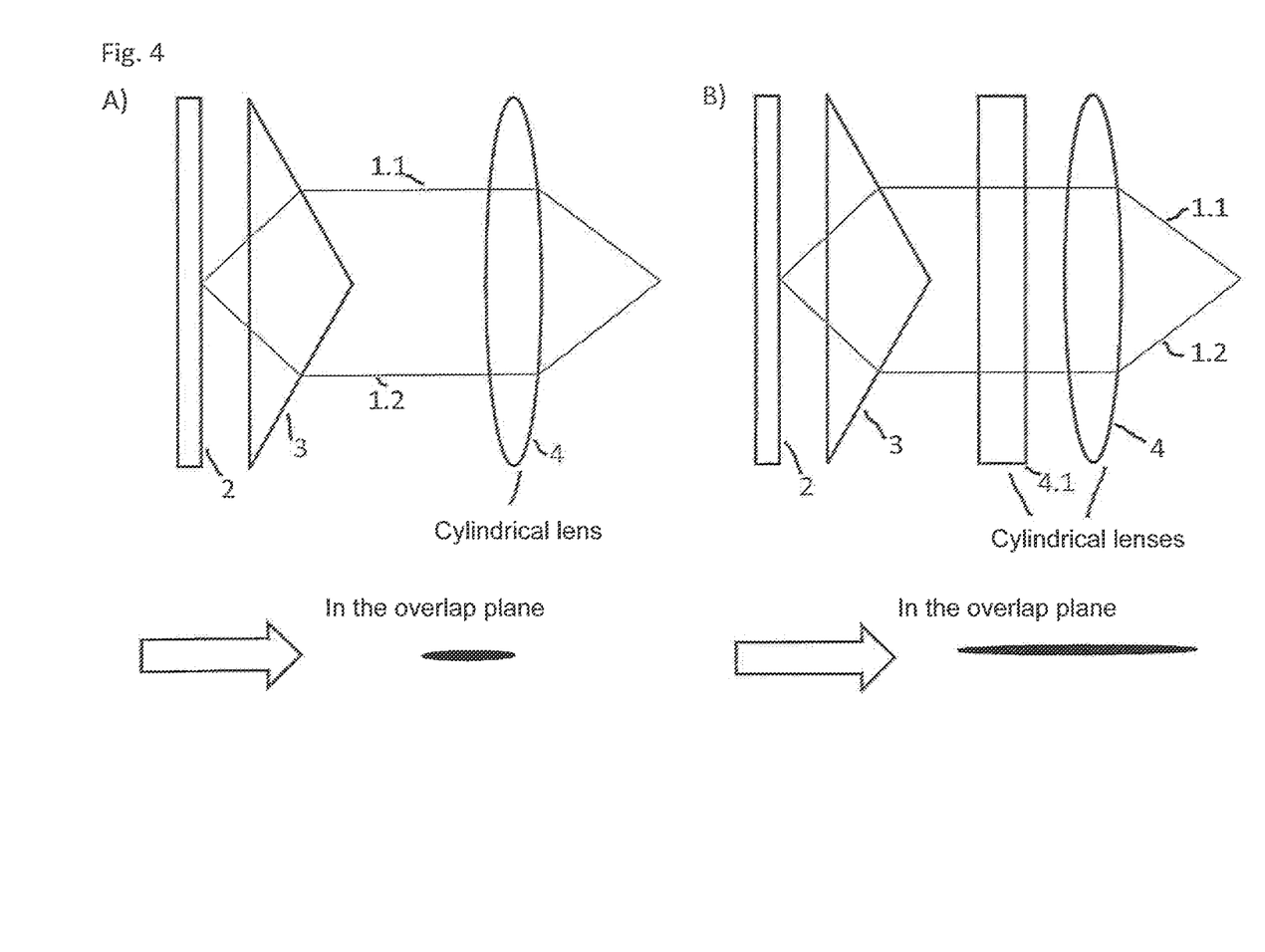
FIG. 4 a schematic representation of two examples of an arrangement which can be used in the invention.
Figure 5:
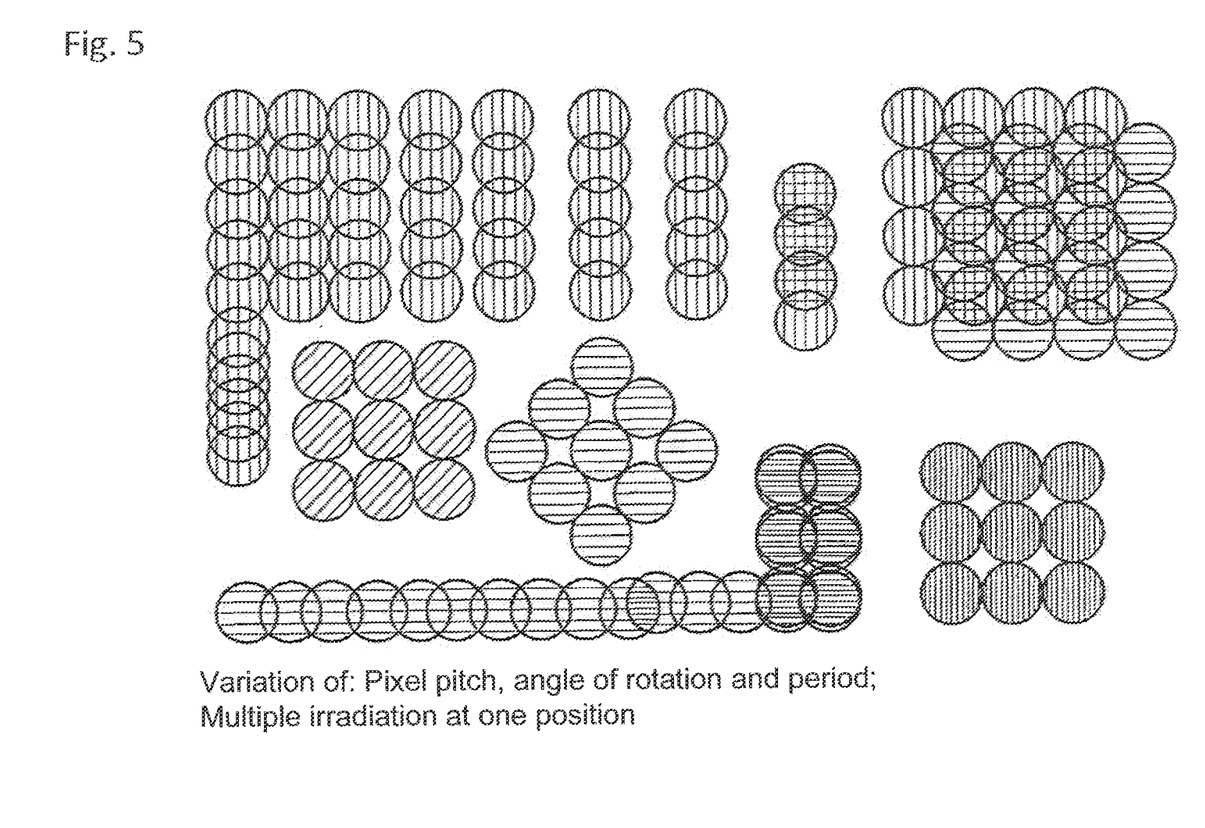
FIG. 5 further examples of surface structures which can be formed using the invention having changed distances of structural elements, changed alignments and periods which can be formed after multiple irradiation at one position.

Two examples of an arrangement which can be used in the invention are shown in FIG. 4. In this respect, a laser beam 1 is directed onto a diffractive element 2 with which it is split into two part beams 1.1 and 1.2 which are directed onto a surface of a biprism 3, as a further optical element, aligned perpendicular to the optical axis of the laser beam 1, and which exit again at the rear side of the biprism and are refracted such that they are aligned in parallel with the optical axis of the laser beam 1 in both examples shown in FIG. 4.

The two part beams 1.1 and 1.2 are directed onto a cylindrical lens as the focusing optical element 4 in the example shown at the left in FIG. 4 so that the part beams 1.1 and 1.2 are focused on a surface to be processed such that the part beams 1.1 and 1.2 interfere at the surface.

In the example shown at the right in FIG. 4, a further cylindrical lens 4.1 is arranged between the biprism 3 and the cylindrical lens as the focusing element 4.

It has been illustrated beneath the arrangement for both examples that the overlap plane of the part beams 1.1 and 1.2 is shorter in the example arranged at the left in FIG. 4 than in the example shown at the right in FIG. 4.

Figure 6:
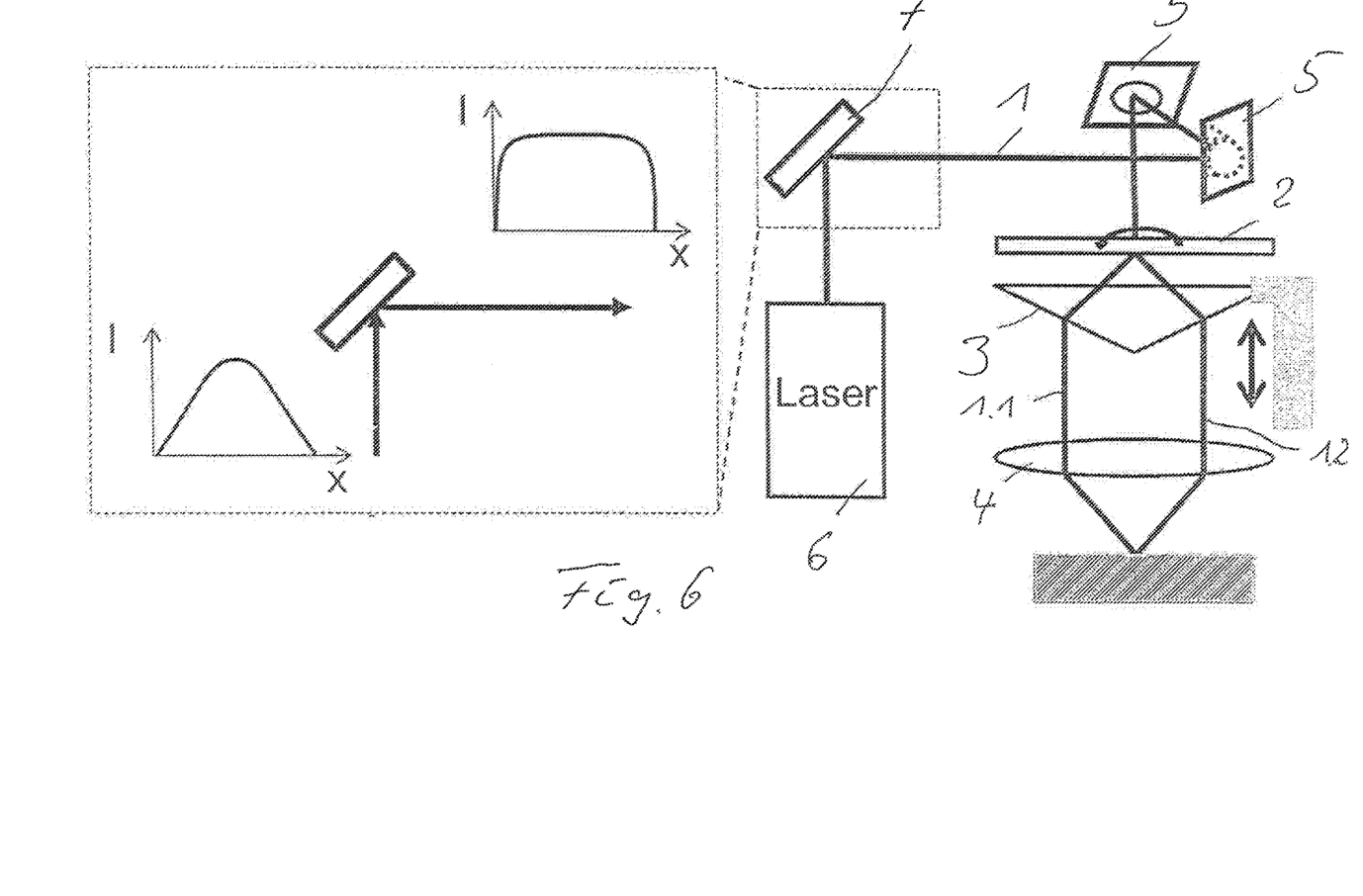
FIG. 6 an example in which the laser beam is shaped by a semi-transparent mirror and is directed onto a diffractive optical element by two pivotable reflective elements.

FIG. 6 shows in a schematic form an example of an arrangement which can be used with the invention in which the laser beam 1 is directed onto a semi-transparent mirror and two reflective elements 5 pivotable about a respective axis. In this respect, the axes of rotation of the reflective elements 5 are aligned perpendicular with one another. The laser beam 1 can thus be aligned two-dimensionally and can be incident at different positions on the surface of the diffractive optical element 2. The positions at which part beams 1.1 and 1.2 exit the diffractive optical element 2 thereby change and consequently also the position at which the part beams 1.1 and 1.2 are incident together on the surface of the component 3 and can there form a structuring. Influence can thereby additionally be taken on the structure to be formed.

In a form not shown, the distance d2 between the further optical element 3 and the focusing optical lens 4 can also be changed. The further optical element 3 can in this respect be a biprism or also a conical element (axicon) or a pyramid-shaped element whose tip faces in the direction of the component 3. In addition to the already mentioned focusing and cylindrical lenses, an f-theta lens can also be used as a focusing optical element 4 for the focusing. In this respect, the further optical element 3 can be moved in a translatory movement in parallel with the optical axis of the laser beam 1.

In this example, a semi-transparent reflective element 7, which has a trans-mission gradient for the respective laser radiation over the surface on which the laser beam 1 is incident, is present in the optical path between the laser source 6 and the reflective element 5. A non-rotationally symmetrical intensity profile of the laser beam 1 which is incident on the diffractive optical element 2 can thus e.g. be achieved. The intensity profile of the part beams 1.1 and 1.2 can thereby also be non-rotationally symmetrical.

In all the examples shown, there is also the possibility of rotating the diffractive optical element 2 about an axis. This can preferably be aligned in parallel with the optical axis at which the laser beam 1 is incident on the surface of the diffractive optical element 2.

Figure 7:
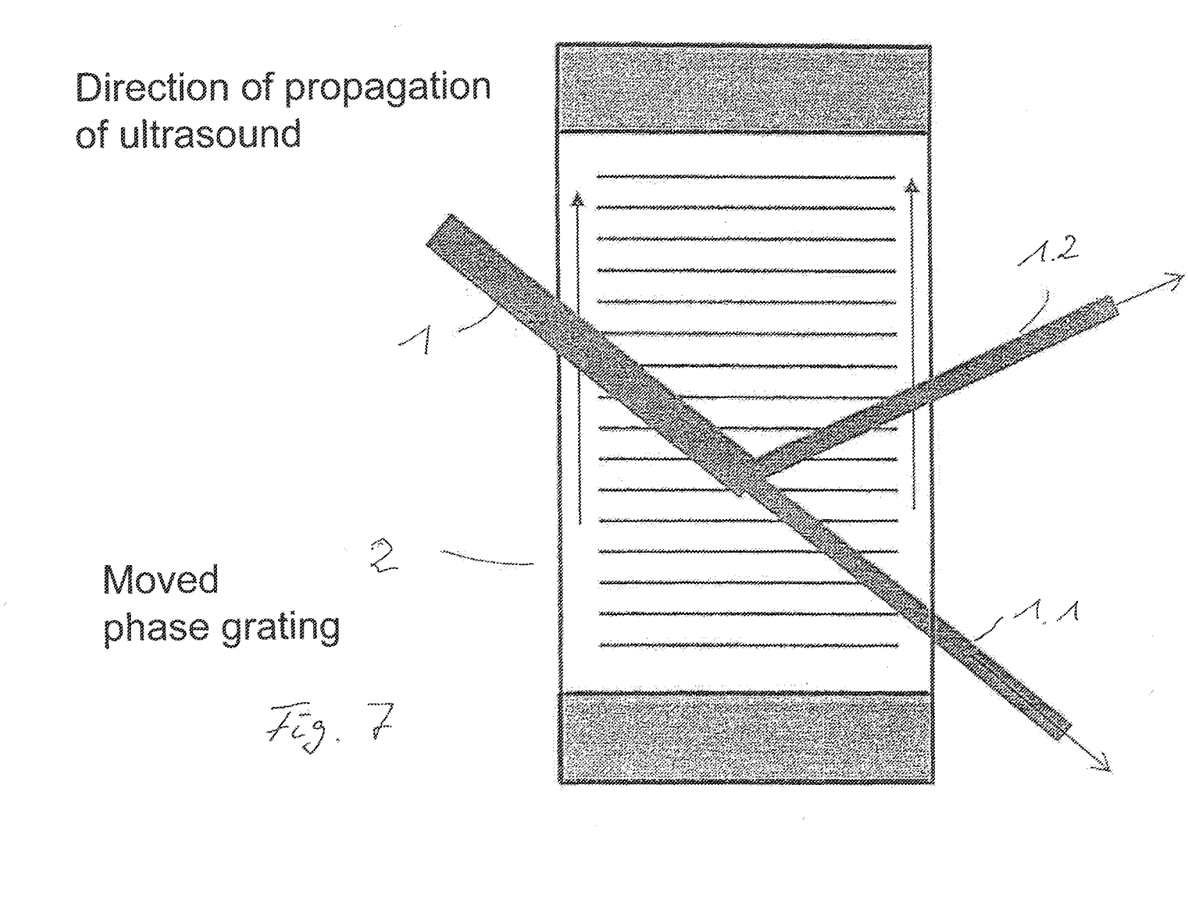
FIG. 7 in schematic form, the possible use of an acousto-optic modulator for a splitting of a laser beam into part beams.

FIG. 7 shows in a schematic form the use of an acousto-optic modulator in the place of a diffractive optical element 2 for the splitting of a laser beam into part beams 1.1 and 1.2.

The invention claimed is:

1. A method for forming a surface structuring at surfaces of components using a laser beam, wherein the laser beam (1) is directed onto a diffractive optical element (2) or onto an acousto-optic modulator and is split by the diffractive optical element (2) or by the acousto-optic modulator into at least two part beams (1.1 and 1.2); and
the part beams (1.1 and 1.2) are directed onto at least one further optical element (3), which is transparent for the laser radiation, at an angle α with respect to the optical axis of the laser beam (1), wherein
the further optical element(s) (3) has/have a first surface and a second surface which is inclined at an angle to the optical axis of the laser beam (1) at which the beam direction of the part beams (1.1 and 1.2) is changed by optical refraction; and
the part beams (1.1 and 1.2) are focused by a focusing optical lens (4) arranged between the further optical element (s) 3 and a component surface to be processed such that they are incident at a common position on the surface of the component at an angle of incidence β with respect to the optical axis of the laser beam (1); wherein
the distance d1 between the diffractive optical element (2) or the acousto-optic modulator and the further optical element (3) is changed to change the interference period.

2. A method in accordance with claim 1, characterized in that the part beams (1.1, 1.2) are directed onto at least one further optical element at the same angle α with respect to the optical axis of the laser beam; and/or
the part beams (1.1, 1.2) are directed onto the surface of the component at the same angle of incidence β with respect to the optical axis of the laser beam (1).

3. A method in accordance with claim 1, characterized in that the laser beam (1) is emitted by a laser radiation source in pulse operation.

4. A method in accordance with claim 1, characterized in that an optical prism, a wedge plate or an optical element (3) formed at a surface in be form of a pyramid or of a truncated pyramid, in the form of a polyhedron, in the form of a cone or of a truncated cone is used as the at least one further optical element (3).

5. A method in accordance with claim 1, characterized in that an optical grating is used as the diffractive optical element (2).

6. A method in accordance with claim 1, characterized in that the diffractive optical element is rotated about an axis.

7. A method in accordance with claim 1, characterized in that one-dimensional or two-dimensional interference patterns are formed whose period and/or alignment is/are changeable.

8. A method in accordance with claim 1, characterized in that the laser beam (1) is directed, deflected by at least one reflective element (5), at least one-dimensionally onto the diffractive optical element (2) or onto the acousto-optic modulator.

9. A method in accordance with claim 1, characterized in that the diffractive optical element (2) is rotated about an axis in parallel with the optical axis of the laser beam (1) directed in a perpendicular manner onto the diffractive optical element (2).

10. A method in accordance with claim 1, characterized in that the distance d2 between the further optical element (3) and the focusing optical lens (4) is changed.

11. A method in accordance with claim 1, characterized in that the intensity profile of the laser beam (1) is modified by an additional optical element (7).

12. A method in accordance with claim 11, characterized in that a non-rotationally symmetrical intensity profile of the laser beam (1) or an intensity profile of the laser beam (1) inhomogeneous over the cross-sectional surface is achieved.

13. An arrangement for carrying out the method in accordance with claim 1, characterized in that a laser beam (1) is directed onto a diffractive optical element (2) or onto an acousto-optic modulator for splitting into part beams (1.1, 1.2) and the part beans (1.1, 1.2) are directed onto at least one further optical element (3) which is transparent for the laser radiation at an angle α with respect to the optical axis of the laser beam (1), wherein
the further optical element (s) (3) has/have a first surface and a second surface which is inclined at an angle to the optical axis of the laser beam (1) at which the beam direction of the part beams (1.1 and 1.2) is changed by optical refraction; and
the part beams (1.1 and 1.2) are incident at a common position at an angle of incidence β with respect to the optical axis of the laser beam (1) onto the surface or the component by means of a focusing optical lens (4) arranged between the further optical element(s) (3) and a component surface to be processed.

14. An arrangement in accordance with claim 13, characterized in that a further al optical element (3) is an optic prism, a wedge plate, an optical element (3) formed at a surface in the form of a pyramid or of a truncated pyramid, in the form of a polyhedron, in the form of a cone or of a truncated cone and the diffractive optical element (2) is an optical grating.

15. An arrangement in accordance with claim 13, characterized in that the diffractive optical element (2) is rotatable about an axis.

16. An arrangement in accordance with claim 13, characterized in that at least one reflective element (5), which is pivotable about at least one axis, is arranged in the optical path of the laser beam (1) or of the part beams (1.1, 1.2).

17. An arrangement in accordance with claim 13, characterized in that a beam-shaping reflective or transmitting element (7), which has a reflection gradient or a transmission gradient over its surface, or an adaptive optical element is/are arranged in front of the diffractive optical element (2) or the acousto-optic modulator in the optical path of the laser beam (1).

18. An arrangement in accordance with claim 13, characterized in that an adaptive optical element (7) has an irregularly curved surface or its surface onto which the laser beam is directed is changeable with respect to its curvature.

* * * * *